(12) United States Patent
Pikulin et al.

(10) Patent No.: US 11,973,131 B2
(45) Date of Patent: Apr. 30, 2024

(54) GATING A SEMICONDUCTOR LAYER INTO A QUANTUM SPIN HALL INSULATOR STATE

(71) Applicant: Microsoft Technology Licensing, LLC, Redmond, WA (US)

(72) Inventors: Dmitry Pikulin, Vancouver (CA); Georg Wolfgang Winkler, Santa Barbara, CA (US); Rafal Maciej Rechcinski, Warsaw (PL); Dominik André Gresch, Zurich (CH)

(73) Assignee: Microsoft Technology Licensing, LLC, Redmond, WA (US)

( * ) Notice: Subject to any disclaimer, the term of this patent is extended or adjusted under 35 U.S.C. 154(b) by 342 days.

(21) Appl. No.: 17/396,057

(22) Filed: Aug. 6, 2021

(65) Prior Publication Data
US 2023/0038763 A1    Feb. 9, 2023

(51) Int. Cl.
*H01L 29/66* (2006.01)
(52) U.S. Cl.
CPC .............................. *H01L 29/66984* (2013.01)
(58) Field of Classification Search
CPC ................................................ H01L 29/66984
USPC .................................................. 327/109, 528
See application file for complete search history.

(56) References Cited

U.S. PATENT DOCUMENTS

| | | | |
|---|---|---|---|
| 10,346,348 B2 | 7/2019 | Hastings et al. | |
| 10,490,600 B2 | 11/2019 | Freedman et al. | |
| 10,496,933 B1 | 12/2019 | Karzig | |
| 10,692,010 B2 | 6/2020 | Freedman et al. | |
| 11,010,684 B2 | 5/2021 | Pikulin | |
| 2012/0273763 A1* | 11/2012 | Banerjee ................ | H10N 99/03 257/E29.168 |
| 2017/0040418 A1 | 2/2017 | Chen et al. | |
| 2018/0052806 A1 | 2/2018 | Hastings et al. | |
| 2018/0053809 A1 | 2/2018 | Freedman et al. | |
| 2019/0013457 A1 | 1/2019 | Lutchyn et al. | |

OTHER PUBLICATIONS

Bernevig, et al., "Quantum Spin Hall Effect and Topological Phase Transition in HgTe Quantum Wells", In Journal of Science, vol. 314, Dec. 15, 2006, pp. 1757-1761.
Gresch, et al., "High-throughput Construction of Symmetrized Wannier Tight-binding Models From ab Initio Calculations", In Repository of arXiv:1805.12148v1, May 30, 2018, 23 Pages.
(Continued)

*Primary Examiner* — Tomi Skibinski
(74) *Attorney, Agent, or Firm* — Ranjeev Singh; Singh Law, PLLC

(57) ABSTRACT

Examples described in this disclosure relate to gating a semiconductor layer into a quantum spin Hall insulator state, Certain examples further relate to using quantum spin Hall insulators as topological quantum qubits. Quantum spin Hall systems may rely upon the quantum spin Hall effect by causing a state of a matter to change from a certain phase to an inverted bandgap phase. In one example, the present disclosure relates to a device including a semiconductor layer comprising an active material. The device further includes a gate coupled to the semiconductor layer, where the semiconductor layer is operable in a quantum spin Hall insulator state by using electrons and holes from the active material in response to an application of an electric field to the semiconductor layer via the gate.

20 Claims, 8 Drawing Sheets

(56) References Cited

OTHER PUBLICATIONS

Karzig, et al., "Scalable Designs for Quasiparticle-Poisoning-Protected Topological Quantum Computation with Majorana Zero Modes", In Repository of arXiv:1610.05289v4, Jun. 21, 2017, 34 Pages.

Knez, et al., "Evidence for Helical Edge Modes in Inverted InAs / GaSb QuantumWells", In Journal of Physical Review Letters, vol. 107, Issue 13, Sep. 19, 2011, 5 Pages.

König, et al., "Quantum Spin Hall Insulator State in HgTe Quantum Wells", In Journal of Science, vol. 318, Issue 5851, Nov. 2, 2007, pp. 766-770.

Maciejko, et al., "The Quantum Spin Hall Effect", In Journal of Review in Advance, Dec. 3, 2010, pp. 31-53.

Mi, et al., "Proposal for the Detection and Braiding of Majorana Fermions in a Quantum Spin Hall Insulator", In Journal of Physical Review B, vol. 87, Issue 24, Jun. 20, 2013, 5 Pages.

Pikulin, Dmitry I., "Proposal for a Scalable Charging-Energy-Protected Topological Qubit in a Quantum Spin Hall System", In Repository of arXiv:2011.04691, Nov. 9, 2020, 6 Pages.

Sarma, et al., "Majorana Zero Modes and Topological Quantum Computation", In Journal of npj Quantum Information, vol. 1, Issue 1, Oct. 27, 2015, 13 Pages.

Tan, Yaohua P., "Tight Binding Parameters of AIP", Retrieved from: https://nanohub.org/resources/22375/download/InSb_parameters.pdf, May 28, 2015, 4 Pages.

Tang, et al., "Quantum Spin Hall State in Monolayer 1T'-WTe2", In Journal of Nature Physics, vol. 13, Issue 7, Jun. 16, 2017, pp. 683-687.

Mu, et al., "Effective g-Factors of Carriers in Inverted InAs/GaSb Bilayers", In Journal of Applied Physics Letters, vol. 108, Issue 1, Jan. 4, 2016, 5 Pages.

"International Search Report and Written Opinion Issued in PCT Application No. PCT/US2022/034770", dated Nov. 22, 2022, 17 Pages.

* cited by examiner

510

550

500

GATING A SEMICONDUCTOR LAYER INTO A QUANTUM SPIN HALL INSULATOR STATE

BACKGROUND

Quantum spin Hall systems rely upon the quantum spin Hall effect. Current designs for quantum spin Hall systems are difficult to fabricate because such systems either require multi-layer stacks of materials that require multi-dimensional optimization or require single atomic layer thickness. Accordingly, there is a need for improved methods and devices that utilize the quantum spin Hall effect.

SUMMARY

In one example, the present disclosure relates to a device including a semiconductor layer comprising an active material. The device may further include a gate coupled to the semiconductor layer, where the semiconductor layer is operable in a quantum spin Hall insulator state by using electrons and holes from the active material in response to an application of an electric field to the semiconductor layer via the gate.

In another aspect, the present disclosure relates to a method comprising providing a semiconductor layer comprising an active material. The method may further include providing a gate coupled to the semiconductor layer. The method may further include operating the semiconductor layer in a quantum spin Hall insulator state by using electrons and holes from the active material in response to an application of an electric field to the semiconductor layer via the gate.

In yet another aspect, the present disclosure relates to a device comprising a semiconductor layer comprising an active material. The device may further include a first dielectric layer formed adjacent to a first surface of the semiconductor layer. The device may further include a first gate formed adjacent to the first dielectric layer. The device may further include a second dielectric layer formed adjacent to a second surface, opposite to the first surface, of the semiconductor layer. The device may further include a second gate, formed adjacent to the second dielectric layer, where the first gate and the second gate are operable to couple a voltage to the semiconductor layer such that the semiconductor layer is operable in a quantum spin Hall insulator state by using electrons and holes from the active material in response to an application of an electric field to the semiconductor layer, perpendicular to the first surface and the second surface.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
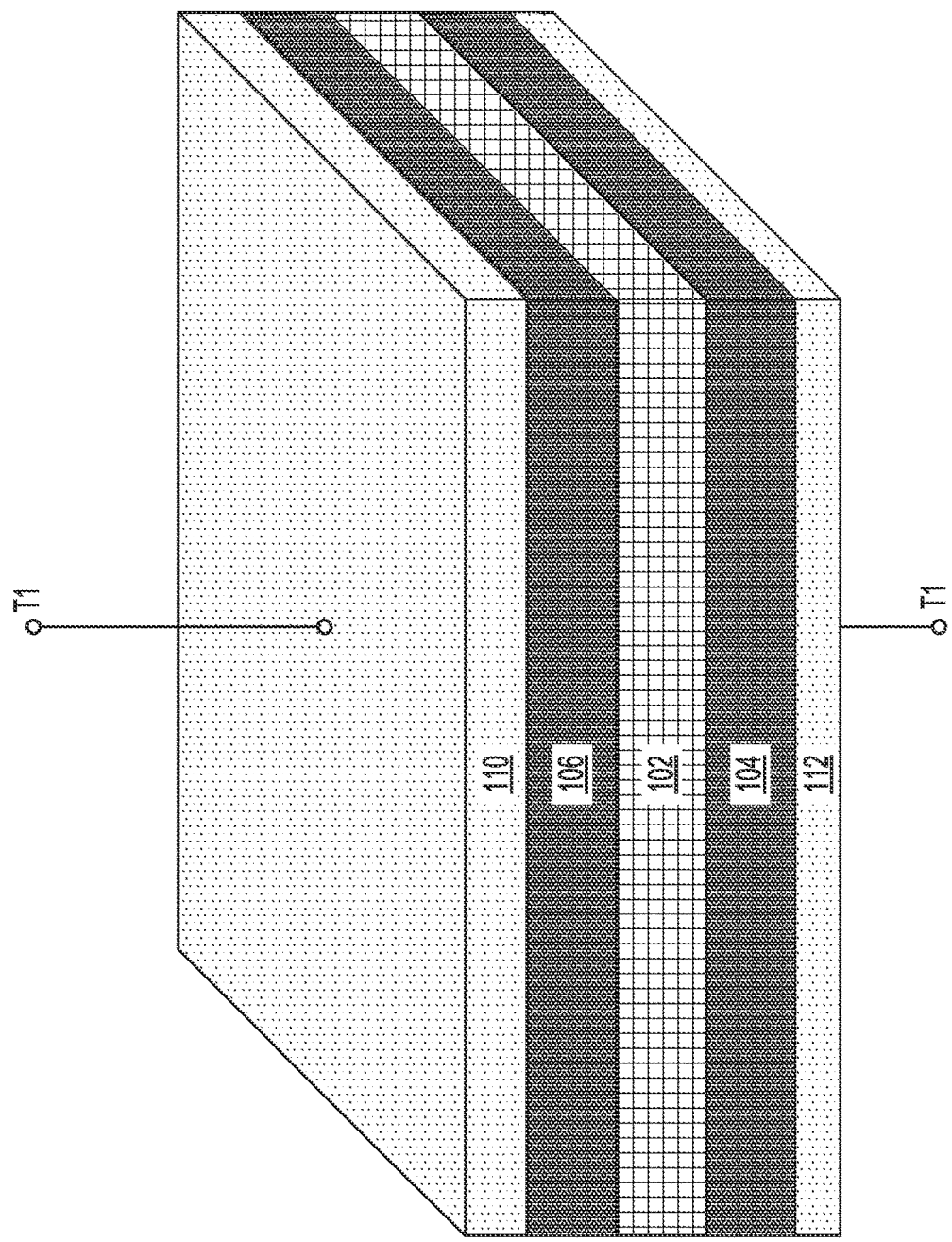
FIG. 1 shows a diagram of a quantum spin Hall insulator in accordance with one example.

Examples described in this disclosure relate to gating a semiconductor layer into a quantum spin Hall insulator state. Certain examples further relate to using quantum spin Hall insulators as topological quantum qubits. Broadly speaking, quantum spin Hall systems rely upon the quantum spin Hall effect by causing a state of a matter to change from a certain phase to an inverted bandgap phase. Current designs for quantum spin Hall systems are difficult to fabricate because such systems either require multi-layer stacks of materials that require multi-dimensional optimization or require single atomic layer thickness. Examples described in the present disclosure allow for the creation of the quantum spin Hall effect by using a layer of more widely available semiconductors, such as indium arsenide (InAs), indium antimonide (InSb), and the like. Parameters associated with the quantum spin Hall insulators, including a thickness of the semiconductor layer of the material(s) used to form the insulator and a magnitude of an electric field applied to the semiconductor layer, are chosen by performing simulations and exploratory experiments. Advantageously, the use of the widely available semiconductors makes the fabrication and the usage of the quantum spin Hall effect based devices and systems relatively easier than the fabrication and the usage of conventional quantum spin Hall effect based devices and systems.

Certain portions of the example devices and systems may be formed using in-situ growth of a semiconductor or other materials on a wafer. Example wafers include wafers formed using any of indium phosphide (InP), indium arsenide (InAs), indium antimonide (InSb), or any other appropriate combination of materials selected from groups II, III, IV, V, and VI of the periodic table, or any ternary compounds of three different atoms of materials selected from groups II, III, IV, V, and VI of the periodic table. As an example, the wafers having devices that exhibit quantum spin Hall effect may be formed by epitaxial growth or deposition of any of these combination of materials on a substrate.

Certain examples further relate to using the devices that rely upon the gating of a semiconductor layer into quantum spin Hall insulator state as part of physical systems for building a quantum computer. Various physical systems, including trapped ions, nuclear spins, electron spins in semiconductors, photons, and other types of systems, have been proposed for building a quantum computer. Each of these systems aims to realize a qubit (the quantum equivalent of a bit), which rather than having a value of 0 or a value of 1, is represented by a vector that evolves pursuant to the rules of quantum physics. Topological quantum computing may provide better performance than traditional quantum computing approaches. Certain examples in the present disclosure relate to *Majorana* zero mode (MZM)-based topological quantum computing systems. Examples of the MZM-based topological quantum computing systems described in the present disclosure relate to topological-insulator (TI)-based MZMs. Although the quantum spin Hall effect based devices and methods may be used primarily in quantum computing applications, their use is not limited to such applications only. As such, quantum spin Hall insulators described herein may also be used in other applications, including as part of radio astronomy systems, communications and satellite systems, Wi-Fi systems, radar systems, and other tele-communications (e.g., 5G or 6G cellular systems), defense-related systems, infrared detectors, solar panels, and the like.

FIG. 1 shows a diagram of a quantum spin Hall insulator 100 in accordance with one example. In this example, quantum spin Hall insulator 100 may be formed using semiconductor fabrication techniques. Quantum spin Hall insulator 100 may include a semiconductor layer 102 arranged between a dielectric layer 104 and another dielectric layer 106. Thus, dielectric layer 104 may be formed adjacent to a first surface (e.g., the bottom surface of semiconductor layer 102) and dielectric layer 106 may be formed adjacent to a second surface (e.g., the top surface of semiconductor layer 102). Semiconductor layer 102 may comprise an active material that allows this layer to operate in a quantum spin Hall state by using electrons and holes from the same active material in response to an application of an electric field to the semiconductor layer via the gate. Quantum spin Hall insulator 100 may further include a top gate 110 and a bottom gate 112. Each of these layers and structures may be formed using molecular-beam epitaxy (MBE). As an example, the MBE related process may be performed in an MBE system that allows the deposition of the appropriate materials in a vacuum. Other techniques, such as chemical vapor deposition (CVD), may also be used.

In this example, semiconductor layer 102 may be formed using an indium arsenide (InAs) layer or an indium antimonide (InSb) layer. In one example, semiconductor layer 102 may be an asymmetric structure including one surface that is cationic (indium) and the other anionic (arsenide). In this example, the thickness of semiconductor layer 102 may have a range between 2 nanometers to 15 nanometers. As used in this disclosure, the term "between" when used in connection with a range of values includes the endpoint values of the range. Thus, in this example, the thickness of semiconductor layer 102 may be 2 nanometers, 15 nanometers, or any other values between 2 nanometers and 15 nanometers.

With continued reference to FIG. 1, each of dielectric layers 104 and 106 may be formed using dielectrics, such as silicon dioxide ($SiO_2$), aluminum oxide ($Al_2O_3$), hafnium oxide ($HfO_2$), or other suitable dielectric materials. Each of dielectric layers 104 and 106 may also comprise a stack of such materials consisting of multiple layers. As an example, each of dielectric layers 104 and 106 may comprise a stack of a layer of aluminum oxide ($Al_2O_3$) and a layer of hafnium oxide ($HfO_2$). In this example, the layer of aluminum oxide ($Al_2O_3$) may have a thickness of 2 nanometers and the layer of hafnium oxide ($HfO_2$) may have a thickness of 8 nanometers. Indeed, depending upon the node size of the semiconductor process technology being used, other materials with a different thickness may be used for such layers. Moreover, each of dielectric layers 104 and 106 need not comprise the same material(s) or thickness. After the formation of dielectric layers, using semiconductor processing techniques, gates may be formed to allow for the tuning of semiconductor 102. An appropriate electric field may be applied using such gates to tune semiconductor layer 102 into a topological insulator state. Each of the gates (top gate 110 and bottom gate 112) may be formed using a doped semiconductor, an appropriate metal (e.g., gold (Au), or a metal alloy (e.g., titanium-gold (Ti—Au)). In this example, a bias voltage may be used to apply an electric field to semiconductor layer 102. The electric field may be applied in a direction that is perpendicular to the top and the bottom surface of semiconductor layer 102.

In one example, different amounts of voltages may be supplied to terminal T1 coupled to top gate 110 and to terminal T2 coupled to bottom gate 112. These voltages may be used to create an electric field in semiconductor layer 102. In this example, the amount of the positive voltage supplied to terminal T1 may range between 0.5 volts to 4 volts and the amount of the negative voltage supplied to terminal T2 may range between −0.5 volts to −5 volts). In one specific example, the positive voltage supplied to terminal T1 may be 1 volt and the negative volage supplied to terminal T2 may be −3.7 volts. This example corresponds to semiconductor layer 102 consisting of indium antimonide (InSb) having a thickness of 5 nanometers, dielectric layer 104 consisting of silicon dioxide ($SiO_2$) having a thickness of 10 nanometers, and dielectric layer 106 consisting of a stack of layers, including a layer of aluminum oxide ($Al_2O_3$) having a thickness of 2 nanometers and a layer of hafnium oxide ($HfO_2$) having a thickness of 8 nanometers. Although not shown in FIG. 1, terminals T1 and T2 may be supplied with the requisite voltage using a voltage regulator, a current source, a charge pump, or another voltage source. The amount of the voltage supplied to each of terminals T1 and T2 may be determined by simulating the operation of quantum spin Hall insulator 100. As an example, simulations may be performed to measure changes in the band gap structures using different combinations of the values of the bias voltages and the thickness of the active material. Alternatively, or additionally, the amount of the voltage necessary for the operation of quantum spin Hall insulator 100 may be determined by measuring the conductance of semiconductor layer 102. In this example, the selected amount of the voltage may correspond to when the quantized value of $2e^2/h$ is reached, where e is the elementary charge and h is Planck's constant.

Although FIG. 1 shows a certain number of layers of quantum spin Hall insulator 100 arranged in a certain manner, there could be more or fewer numbers of layers arranged differently. As an example, besides properly terminated indium arsenide (InAs) and indium antimony (InSb), another family of materials selected from III-V groups, II-VI groups, or II-IV groups may be used to form semiconductor layer 102. One of the requirements for any combination of materials to work is for the conduction band and the valence band of such materials to have a different orbital nature or character (e.g., orbital nature or character that is different by 1); for example, sharp (s) and principal (p) orbitals for indium arsenide (InAs), p and diffuse (d) orbitals for other materials, or d and fundamental (f) orbitals for other materials. Although FIG. 1 refers to the gates as top and bottom gates, because the structure shown in FIG. 1 is symmetric in terms of the gates these labels are interchangeable. Moreover, depending on the orientation of a device in space, the gates may be viewed as being left or right of each other. In addition, although FIG. 1 describes the generation of the electric field via two gates, the electric field may be applied using other control elements. Finally, additional layers, such as buffer layers, may be formed as needed.

Moreover, although quantum spin Hall insulator 100 is described with reference to two gates with one gate receiving a positive voltage and the other gate receiving a negative voltage, both gates may receive positive voltage or negative voltage. As an example, the active material corresponding to semiconductor layer 102 may be doped in a manner that both voltages would shift to tune the chemical potential of an active region associated with semiconductor layer 102 and the two voltages could have the same sign (e.g., positive or negative) due to such a shift. As such, a set of voltages or a voltage may be selected to: (1) maintain a chemical potential of an active region associated with semiconductor layer 102 to be within the band gap and (2) create a voltage difference between a top surface associated with the active region and a bottom surface associated with the active region to exceed the band gap. Indeed, the voltage difference would need to be larger than the band gap since the potential difference in the active region will be smaller due to the presence of the dielectric layers (e.g., dielectric layers 104 and 106 of FIG. 1) in between.

Figure 2:
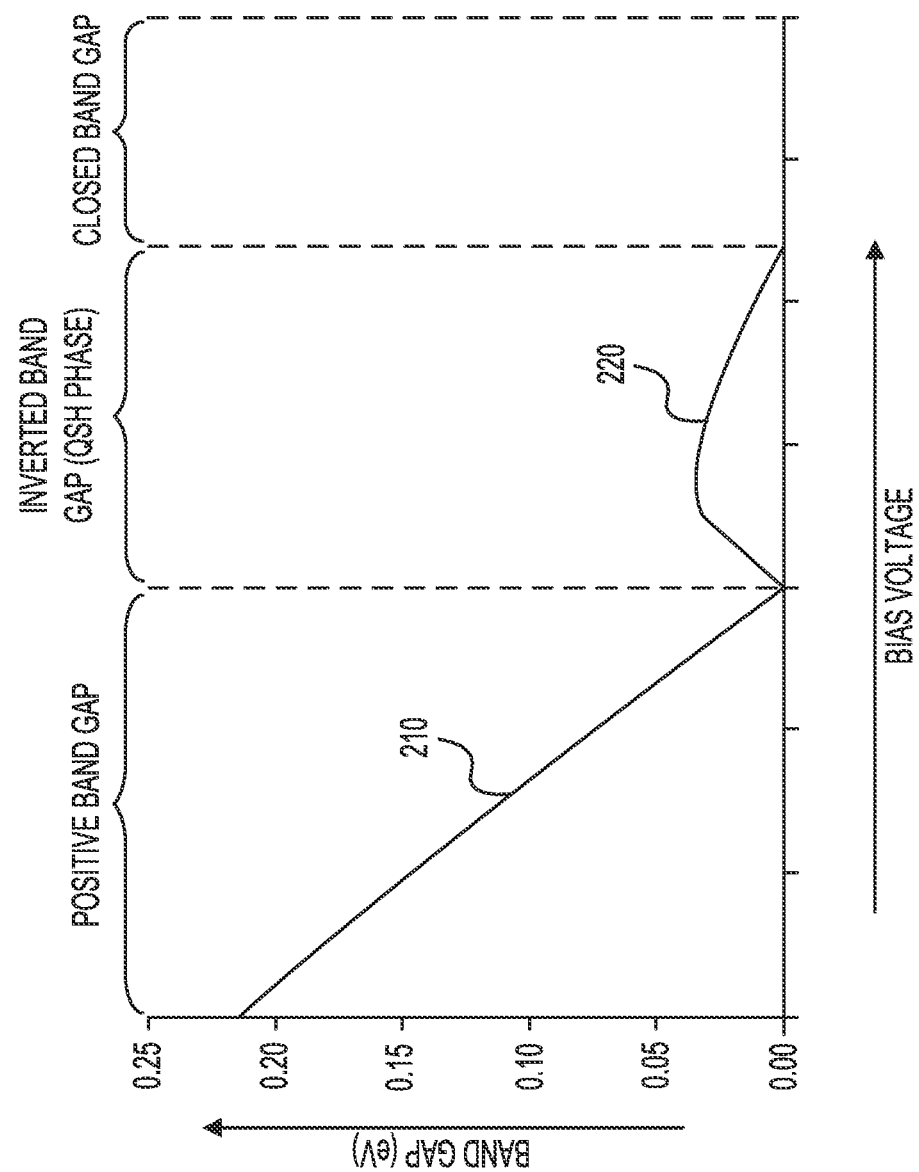
FIG. 2 shows a graph illustrating the behavior of a semiconductor layer in response to the application of an electric field via a bias voltage.

FIG. 2 shows a graph 200 illustrating the behavior of a semiconductor layer (e.g., semiconductor layer 102 of FIG. 1) in response to the application of an electric field via a bias voltage. In this example, graph 200 shows bias voltage along the horizontal axis and the band gap along the vertical axis. The bias voltage affecting the behavior of the semiconductor layer may result from the voltages supplied to terminals T1 and T2 of quantum spin Hall insulator 100 of FIG. 1. Curves 210 and 220 show that as the bias voltage increases, the positive band gap shrinks, and the semiconductor layer begins to transition from an insulating phase to an inverted bandgap phase (also referred to as the QSH phase). Once the bias voltage reaches a certain threshold, the semiconductor layer becomes conducting as a result of the closed band gap.

Figure 3:
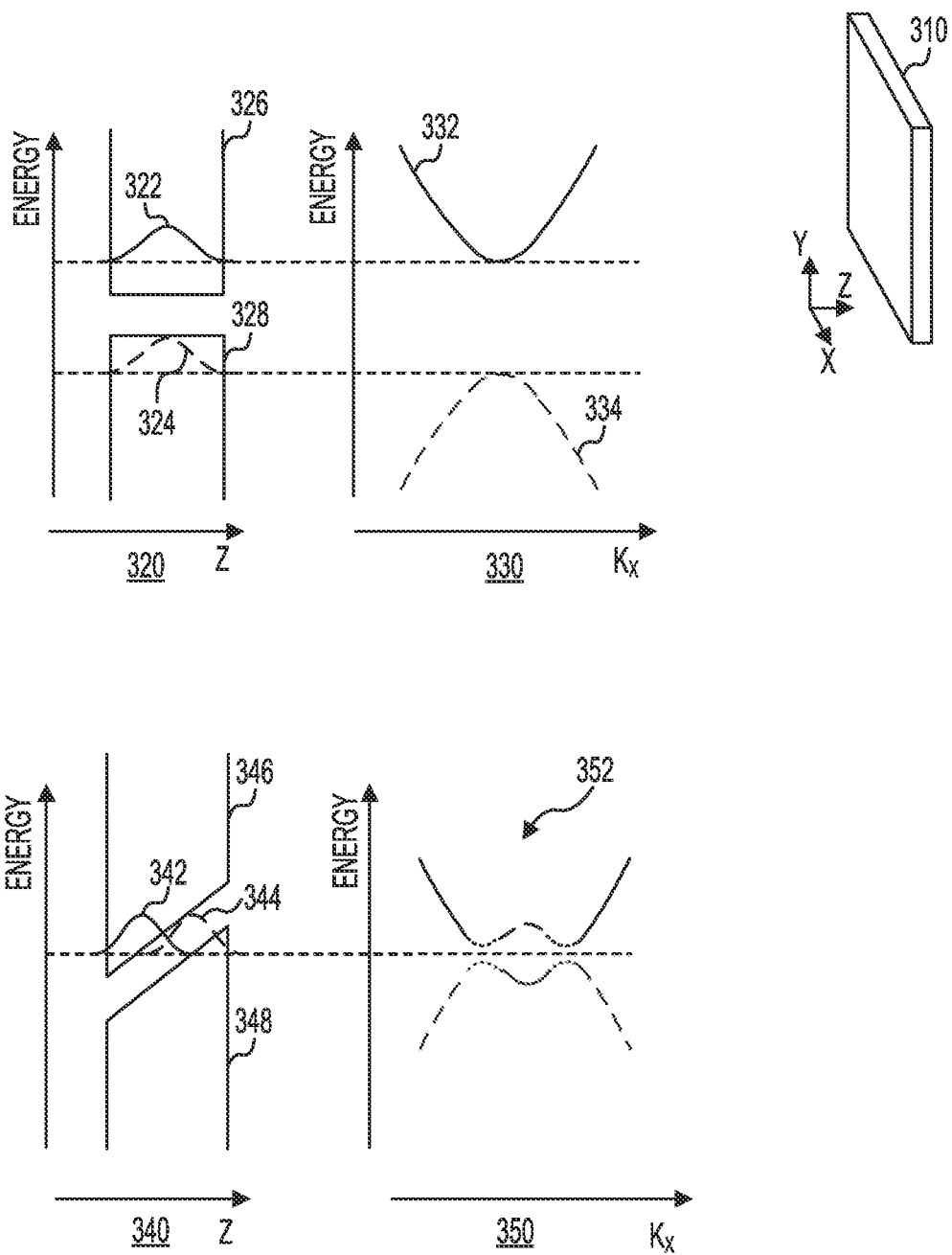
FIG. 3 shows graphs illustrating changes in the wavefunctions and band spectrums of a semiconductor layer in response to the application of an electric field via a bias voltage.

FIG. 3 shows graphs 300 illustrating changes in the wavefunctions and band spectrums of a semiconductor layer (e.g., semiconductor layer 102 of FIG. 1) in response to the application of an electric field via a bias voltage. To illustrate the wavefunctions and the band spectrums associated with the semiconductor layer, a slab 310 associated with this layer is shown in a three-dimensional (X, Y, and Z) coordinate system. Graphs 320 and 330 correspond to wavefunctions and band spectrums when no electric field is being applied to the semiconductor layer. Graphs 340 and 350 correspond to wavefunctions and band spectrums when an electric field is being applied to the semiconductor layer. Curve 322 shows the wavefunction of the electrons when no electric field is applied. Curve 324 shows the wavefunction of the holes when no electric field is applied. Graphical elements 326 and 328 represent the chemical potential for the bands when no electric field is applied. Graph 330 shows a plot of the energy vs. energy dispersion of the electrons and holes in the X-direction (Kx) when no electric field is applied. Curve 332, which corresponds to the conduction band, shows the energy dispersion of the electrons in the X-direction when no electric field is applied and curve 334, which corresponds to the valence band, shows the energy dispersion of the holes in the X-direction when no electric field is applied.

With continued reference to FIG. 3, graphs 340 and 350 correspond to wavefunctions and band spectrums when an electric field is being applied to the semiconductor layer. Curve 342 shows the wavefunction of the electrons when the electric field is applied and curve 344 shows the wavefunction of the holes when the electric field is applied. Graphical elements 346 and 348 represent the chemical potential for the bands when the electric field is applied. The changed shape of the chemical potential reflects redistribution of the electrons and holes as a result of the application of the electric field. Graph 350 shows a plot of the energy vs. energy dispersion of the electrons and holes in the X-direction (Kx) when the electric field is applied. As shown in graph 350, which corresponds to the topological insulator spectrum, the application of the electric field results in the hybridization of the electron states and the hole states, which in turn leads to the quantum spin Hall effect. Thus, example quantum spin Hall insulator 100 can be obtained in a single semiconductor (e.g., InAs or InSb) by gating it to have both electrons and holes at the Fermi level. In other words, while the active material used to fabricate the quantum spin Hall insulator may be a conventional semiconductor, it can be tuned to operate in a topological insulator state by applying an electric field to the active material.

Figure 4:
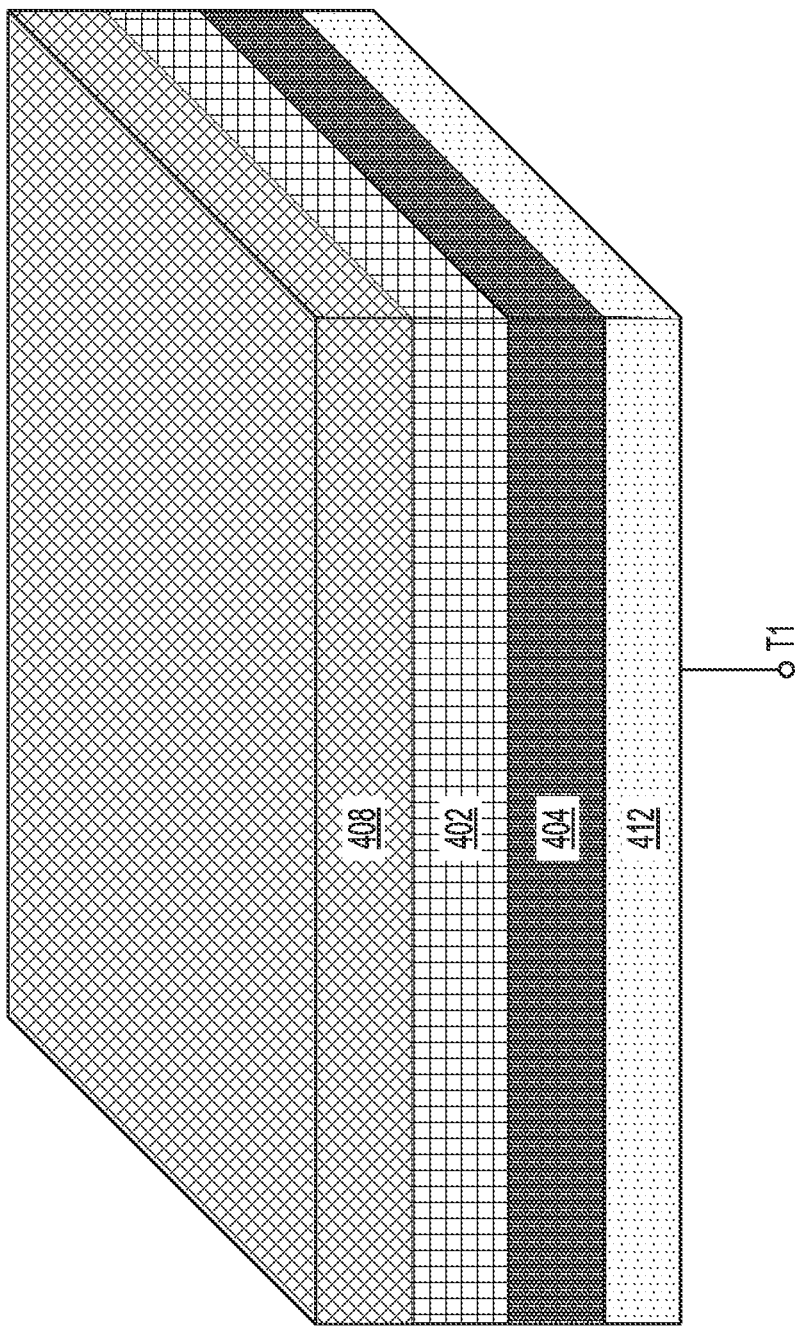
FIG. 4 shows a cross-section view of another quantum spin Hall insulator in accordance with one example.

FIG. 4 shows a cross-section view of another quantum spin Hall insulator 400 in accordance with one example. In this example, one of the two gates (e.g., one of top gate 110 or bottom gate 112 of FIG. 1) can be replaced by a superconducting layer in contact with the active material (e.g., semiconductor layer 102) which can create an electron accumulation layer due to the difference between the work functions of the superconductor layer and the semiconductor layer. In this example, like quantum spin Hall insulator 100, quantum spin Hall insulator 400 may be formed using semiconductor fabrication techniques. Quantum spin Hall insulator 400 may include a semiconductor layer 402 arranged between a dielectric layer 404 and a superconducting layer 408. Any number of masks may be used to define the topologically active areas. A wet etch or a dry etch may be used to etch away any materials. Each of these layers may be formed using molecular-beam epitaxy (MBE). As an example, the MBE related process may be performed in an MBE system that allows the deposition of the appropriate materials in a vacuum. Other techniques, such as chemical vapor deposition (CVD) may also be used.

In this example, semiconductor layer 402 may be formed using an indium arsenide (InAs) layer or an indium antimonide (InSb) layer. In this example, the thickness of semiconductor layer 402 may have a range between 2 nanometers to 20 nanometers. Dielectric layer 404 may be formed using dielectrics, such as aluminum oxide ($Al_2O_3$), hafnium oxide ($HfO_2$), or other suitable dielectric materials. Using semiconductor processing techniques, superconducting layer 408 and gate 412 may be formed. Superconducting layer 408 may comprise a superconductor or a metal that is superconducting. As an example, metals such as niobium may be used to form superconducting layer 408. Gate 412 may allow for the tuning of semiconductor layer 402. An appropriate electric field may be applied using gate 412 to tune semiconductor layer 402 into a topological insulator state. Gate 412 may be formed using a doped semiconductor, an appropriate metal (e.g., gold (Au), a metal alloy (e.g., titanium-gold (Ti—Au)), or a superconducting metal (e.g., aluminum (Al) or niobium (Nb). In this example, a bias voltage may be used to apply an electric field to semiconductor layer 402. The electric field may be applied in a direction that is perpendicular to the top and the bottom surface of semiconductor layer 402.

Still referring to FIG. 4, in one example, voltage may be supplied to terminal T1 coupled to gate 412. This voltage may be used to create an electric field in semiconductor layer 402. Although not shown in FIG. 4, terminal T1 may be supplied with the requisite voltage using a voltage regulator, a current source, a charge pump, or another voltage source. The amount of the voltage supplied to terminal T1 may be determined by simulating the operation of quantum spin Hall insulator 400. As an example, simulations may be performed to measure changes in the band gap structures using different combinations of the values of the bias voltages and the thickness of the active material. Although FIG. 4 shows a certain number of layers of quantum spin Hall insulator 400 arranged in a certain manner, there could be more or fewer numbers of layers arranged differently. As an example, besides properly terminated indium arsenide (InAs) and indium antimony (InSb), other family of materials selected from III-V groups, II-VI groups, or II-IV groups may be used to form semiconductor layer 402. One of the requirements for any combination of materials to work is for the conduction band and the valence band of such materials to have a different orbital nature or character (e.g., orbital nature or character that is different by 1); for example, sharp (s) and principal (p) orbitals for indium arsenide (InAs), p and diffuse (d) orbitals for other materials, or d and fundamental (f) orbitals for other materials.

Although FIG. 4 shows a certain arrangement of layers and a way of coupling voltage(s) to generate the requisite electric filed, other arrangements of layers and ways of coupling of voltage(s) may also be used. As an example, a second dielectric layer may be formed adjacent to superconducting layer 408 such that the second dielectric layer is formed opposite to dielectric layer 404. A voltage coupled via another terminal to the second dielectric layer may allow for the provision of a second gate for the device. In this instance, superconducting layer 408 may act as a floating layer within a stack structure associated with the second gate. Other types of floating gate arrangements may also be used.

Figure 5:
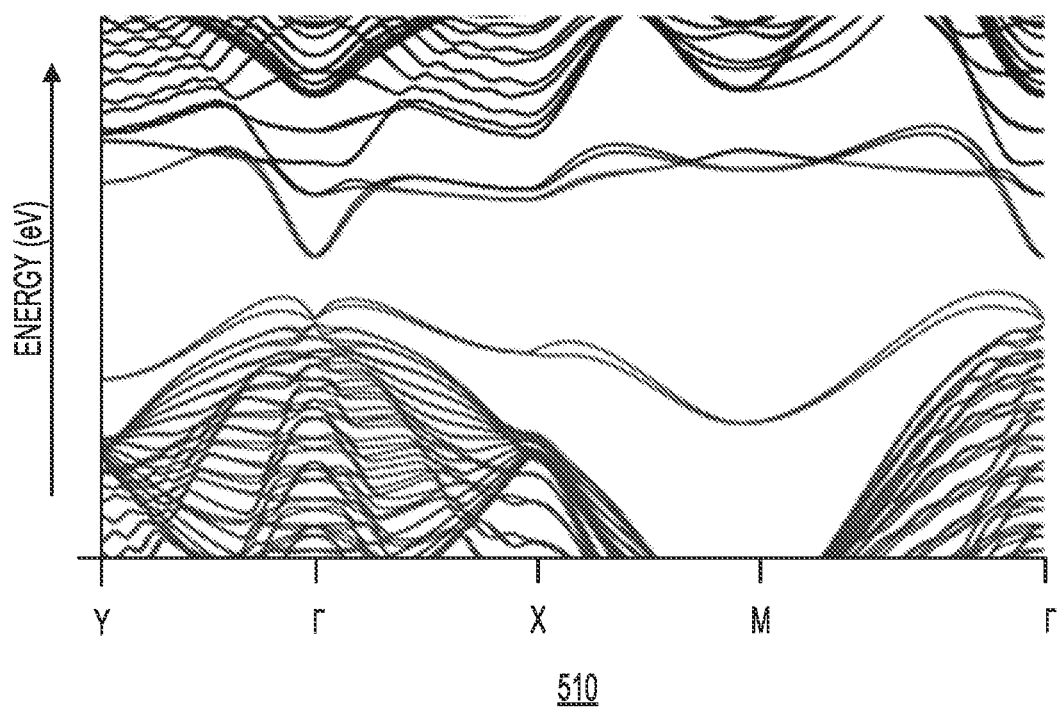
FIG. 5 shows example band structures for a slab of active material associated with a quantum spin Hall insulator.
Figure 5:
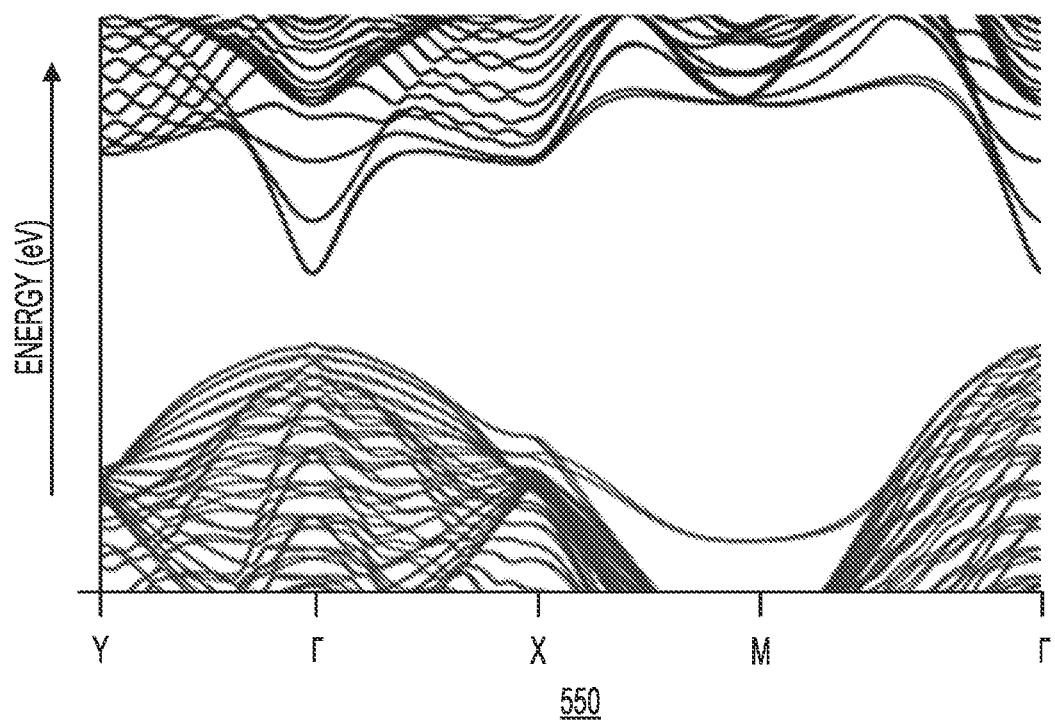

FIG. 5 shows example band structures 500 for a slab of active material associated with a quantum spin Hall insulator. Band structures 500 show energy in the X-axis direction corresponding to the Brillouin zone of the slab of the active material. In this example, the band structures were obtained by simulating a band structure that corresponds to active material having a thickness of 4.09 nm and having 14 monolayers (28 atomic layers) of indium arsenide (InAs). Band structure 510 corresponds to an active material with no passivation and without the application of an electric field. Band structure 550 corresponds to an active material with passivation and with an application of the electric field. Fabrication of the quantum spin Hall insulator (e.g., either of quantum spin Hall insulator 100 or quantum spin Hall insulator 400) may cause a damage to the semiconductor surface. The damage to the semiconductor surface may cause increased roughness and induced impurities, which may cause increased carrier scattering and reduced mobility of the electrons and holes. To address such damage, the semiconductor surface may be passivated (e.g., using hydrogen passivation).

In one example, hydrogen passivation may be performed using a plasma treatment with properly selected precursors (e.g., argon and hydrogen). Plasma treatment may be performed using a plasma source powered by a direct current (DC) power source, a pulsed-DC power source, or a radio frequency (RF) power source. Band structure 510 corresponds to simulation of a slab of active material whose surface states have not been passivated and no electric field has been applied. Band structure 550 corresponds to a simulation of a slab of active material whose surface states have been passivated and an electric field is being applied as described earlier. Additional simulations may be performed to determine each of the positive bias voltage value and the negative bias voltage value (for fixed passivation) that maximizes the inverted band gap while staying in the topological insulator phase. This is because the optimal inverted band gap depends on both the amount of bias voltages and the surface conditions of the active material (e.g., InAs or InSb). Moreover, instead of hydrogen plasma, a helium plasma or a nitrogen plasma may be used.

In addition, the voltage range for the bias voltage can be modified by straining the active material associated with the quantum spin Hall insulators described herein. The strain may be used to modify the band structure in a way that reduces the required voltage on the gates to tune the active material into the quantum spin Hall regime. Strain can be induced mechanically or by growing the active material on a suitable substrate. Any materials, which make an atomic contact with the active material associated with the quantum spin Hall insulator and create a stress, such as gallium antimonide (GaSb), may be used. In addition, strain may be introduced by selecting appropriate materials for the gates, including materials, such as hafnium oxide ($HfO_2$). The substrate associated with the quantum spin Hall insulator may be selected to induce strain. As an example, an indium phosphide (InPh) substrate may be used. Doping may also be used to introduce strain.

Figure 6:
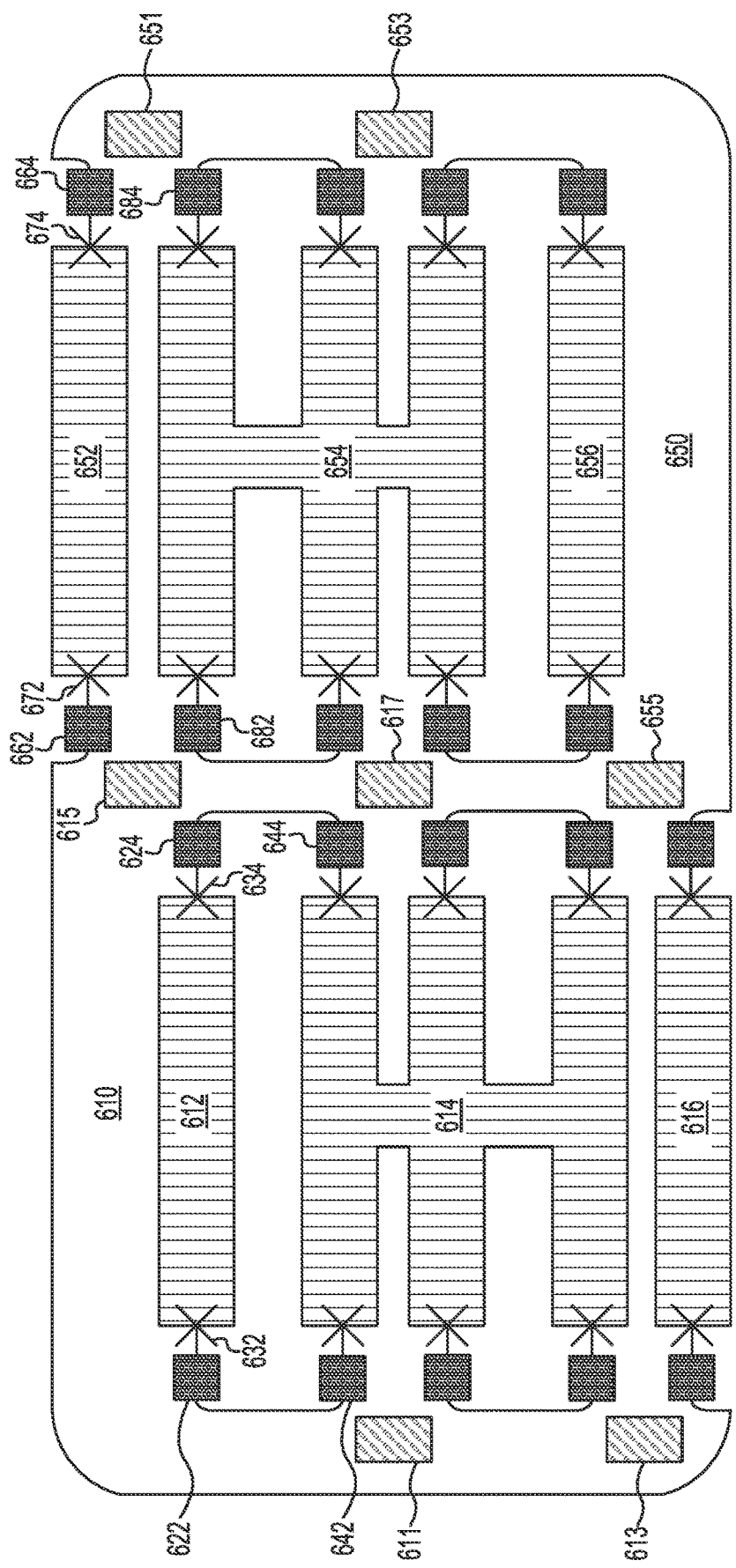
FIG. 6 shows a diagram of an example quantum spin Hall (QSH) system formed using devices described earlier.

FIG. 6 shows a top view of an example quantum spin Hall (QSH) system 600 formed using devices described earlier. QSH system 600 may be used for topological quantum computing. QSH system 600 may include QSH bulk regions 610 and 650. QSH bulk regions 610 and 650 may include quantum spin Hall insulators described earlier. An electric field may be applied to the active material associated with the quantum spin Hall insulators via one or more terminals coupled to one or more gates, as described earlier. As an example, a voltage supply grid may be used to supply bias voltages to semiconductor layers associated with QSH bulk regions 610 and 650. *Majorana* zero modes (e.g., MZMs 632, 634, 672, and 674) may be localized between superconducting islands (e.g., superconducting islands 612, 614, 616, 652, 654, and 656) that are separated from each other using tunable barriers (e.g., tunable barriers 622, 624, 642, 644, 662, 664, 682, and 684). Opening and closing of the tunable barriers may control mutual charging energy of the adjacent superconducting islands. Each of quantum dots (e.g., quantum dots 611, 613, 615, 617, 651, 653, and 655) shown in FIG. 6 correspond to a portion of the QSH bulk system that is tuned to the conduction regime to form a quantum dot. Such tuning may be performed by a local gate arranged above the desired quantum dot position. The quantum dots can also be formed by intentionally pre-doping certain regions of the active layer. Although not shown in FIG. 6, charge sensors may be used to read out a state of any of the superconducting islands or the quantum dots. Although FIG. 6 shows a certain arrangement of components to form quantum spin Hall (QSH) system 600, it may include additional or fewer components that are arranged differently.

Figure 7:
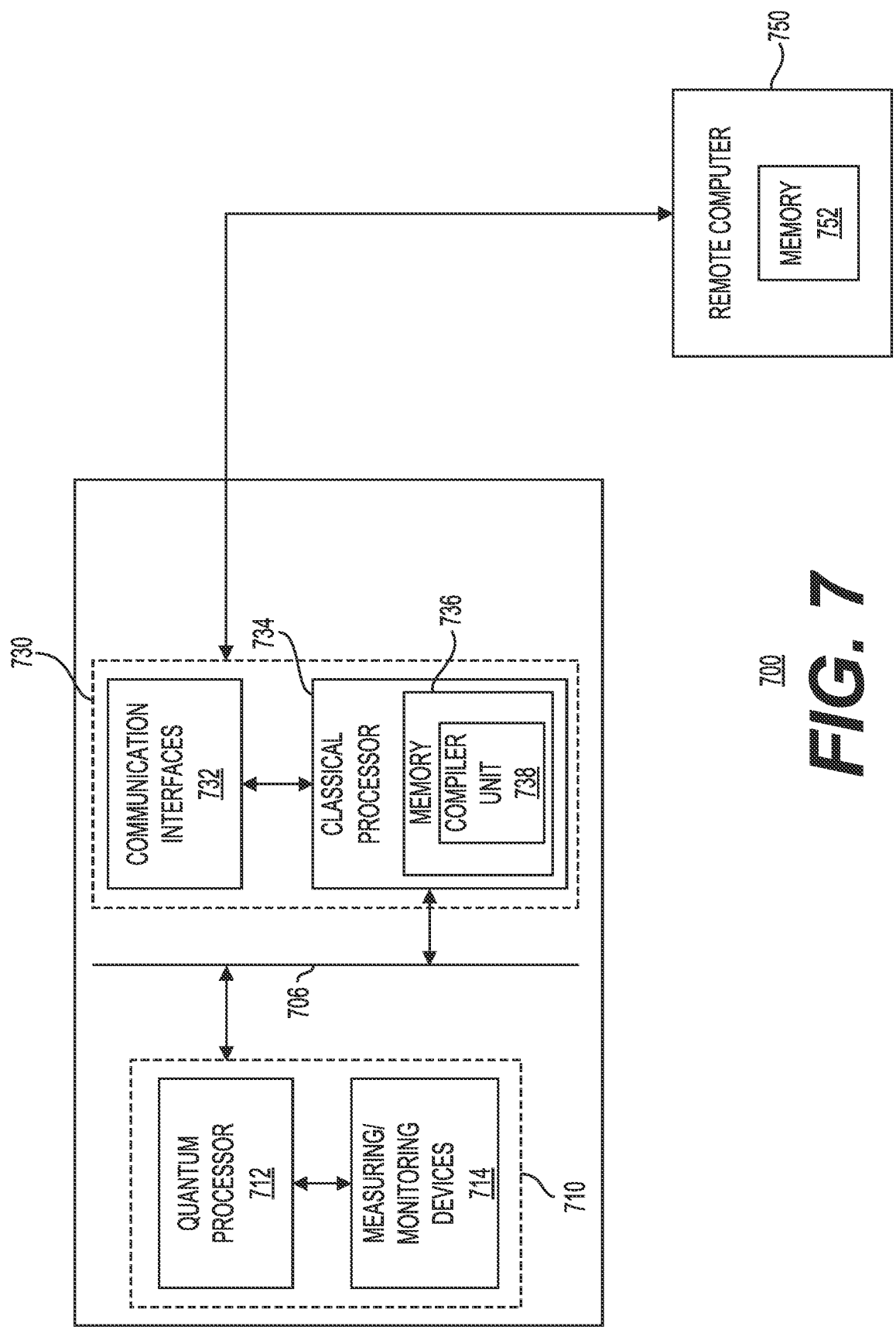
FIG. 7 shows an example system environment for implementing quantum computing systems with quantum spin Hall systems.

FIG. 7 shows an example system environment 700 for implementing quantum computing systems with quantum spin Hall systems. System environment 700 includes a quantum computing system 710 and a classical computing system 730, which is coupled to a remote computer 750. Quantum computing system 710 may include a quantum processor 712 and measuring/monitoring devices 714. In one example, quantum processor 712 and measuring/monitoring devices 714 may be configured to operate in a cryogenic environment (e.g., a temperature between 4 Kelvin and 77 Kelvin and a pressure in a range between $10^{-3}$ Torr to $10^{-10}$ Torr) such that quantum processor 712 may perform operations using qubits based on quantum spin Hall effect insulator described earlier. Classical computing system 730 may include communication interface(s) 732, classical processor 734, and memory 736. Memory 736 may include a compiler unit 738 including libraries and other programs or code to compile a high-level description of a quantum algorithm into quantum circuits. Any quantum computing-related code may be stored in memory 736 or in memory 752, which is associated with remote computer 750. Although the quantum spin Hall effect based devices and methods may be used primarily in quantum computing applications, their use is not limited to such applications only. As such, quantum spin Hall systems described herein may also be used in other applications, including as part of radio astronomy systems, communications and satellite systems, Wi-Fi systems, radar systems, and other tele-communications (e.g., 5G or 6G cellular systems), defense-related systems, infrared detectors, solar panels, and the like.

Figure 8:
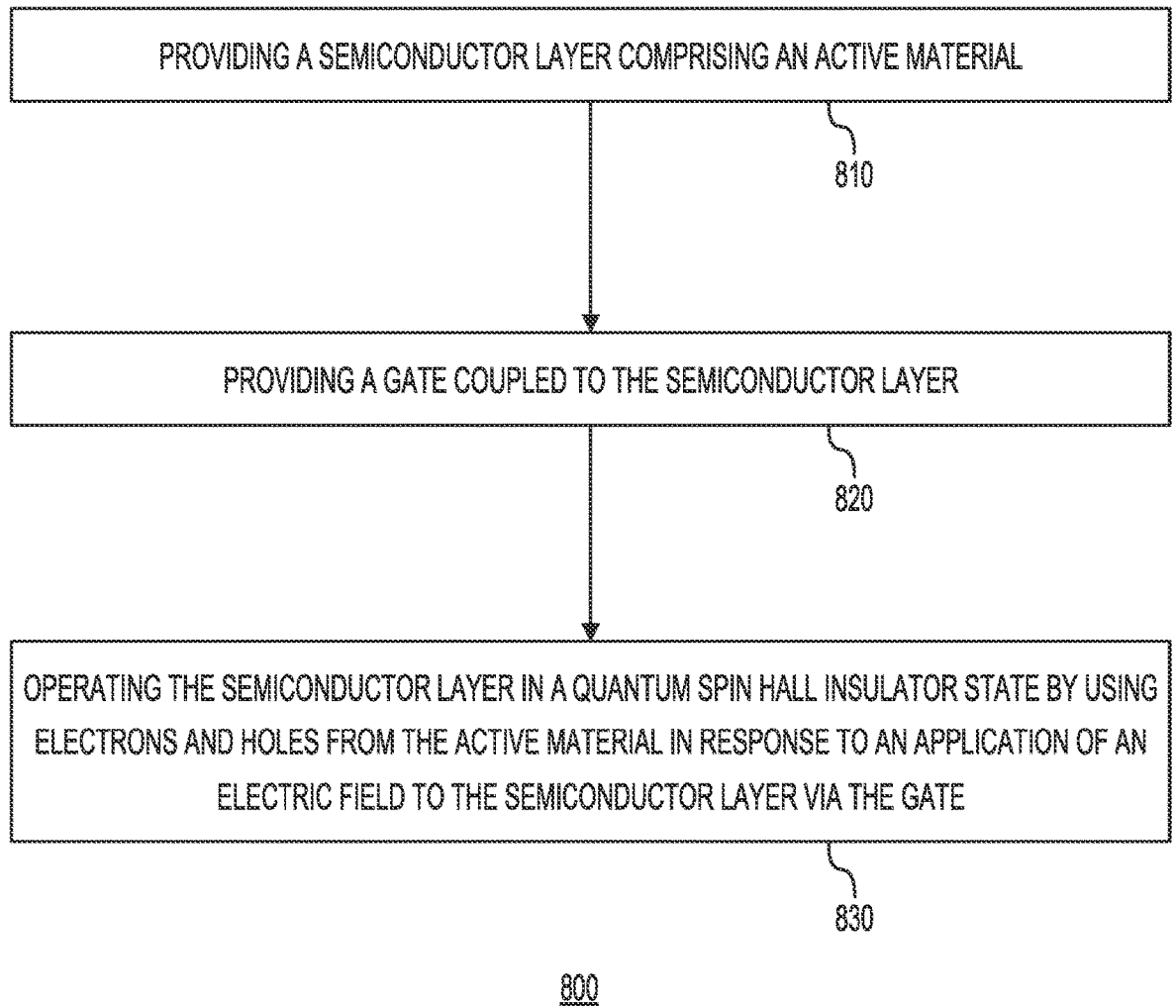
FIG. 8 shows a flow chart of a method for operating a device including a quantum spin Hall insulator in accordance with one example.

FIG. 8 shows a flow chart 800 of a method for operating a device including a quantum spin Hall insulator in accordance with one example. Step 810 may include providing a semiconductor layer comprising an active material. As part of this step, semiconductor layer 102 of FIG. 1 or semiconductor layer 402 of FIG. 4 may be formed or otherwise provided as part of a wafer, a die, an integrated circuit, a packaged IC, or in another configuration. Step 820 may include providing a gate coupled to the semiconductor layer. In one example, as part of this step, gate 110 or 112 of FIG. 1 may be formed or otherwise provided as part of a wafer, a die, an integrated circuit, a packaged IC, or in another configuration. In another example, as part of this step, gate 412 of FIG. 4 may be formed or otherwise provided as part of a wafer, a die, an integrated circuit, a packaged IC, or in another configuration.

With continued reference to FIG. 8, step 830 may include operating the semiconductor layer in a quantum spin Hall insulator state by using electrons and holes from the active material in response to an application of an electric field to the semiconductor layer via the gate. As described earlier, the application of the electric field results in the hybridization of the electron states and the hole states, which in turn leads to the quantum spin Hall insulator state. In one example, the semiconductor layer is operable in the quantum spin Hall state by using electrons and holes exclusively from the active material in response to the application of the electric field to the semiconductor layer via the gate. In another example, electron states from an electron accumulation layer formed at an interface between the semiconductor layer and a superconductor layer may also be used with respect to one surface of the semiconductor layer facing the superconductor layer. In this example, as part of this step, the electric field may be applied using only one gate coupled to the other surface of the semiconductor layer as explained with respect to FIG. 4. Although FIG. 8 describes the steps as being performed in a certain order, the steps may be performed in a different order.

In conclusion, the present disclosure relates to a device including a semiconductor layer comprising an active material. The device may further include a gate coupled to the semiconductor layer, where the semiconductor layer is operable in a quantum spin Hall insulator state by using electrons and holes from the active material in response to an application of an electric field to the semiconductor layer via the gate.

The device may further include a second gate coupled to the semiconductor layer, where the gate is operable to couple a positive bias voltage to the semiconductor layer, and where the second gate is operable to couple a negative bias voltage to the semiconductor layer. The device may further include a first dielectric layer formed between the gate and the semiconductor layer and a second dielectric layer formed between the second gate and the semiconductor layer.

The semiconductor layer of the device may be operable in a quantum spin Hall state by using electrons and holes exclusively from the active material in response to the application of the electric field to the semiconductor layer via the gate. The device may further include a superconductor layer that either may be formed adjacent to the semiconductor layer, or may be formed as a floating layer within a stack structure associated with the gate, where the superconductor layer is formed between a first dielectric layer formed adjacent to the semiconductor layer and a second dielectric layer formed opposite to the first dielectric layer.

The active material may comprise a combination of at least one of a first element and a second element, different from the first element in terms of an orbital character of a conduction band and a valance band associated with the first element and the second element, respectively, where the orbital character is one of a sharp (s) orbital, a principal (p) orbital, a diffuse (d) orbital, or a fundamental (f) orbital. In another example, the active material may comprise at least one element having a conduction band with a different orbital character from a valance band, where the orbital character is one of a sharp (s) orbital, a principal (p) orbital, a diffuse (d) orbital, or a fundamental (f) orbital.

The active material may comprise at least one element having a band gap, and the electric field may be applied in response to a voltage selected to: (1) maintain a chemical potential of an active region associated with the semiconductor layer to be within the band gap and (2) create a voltage difference between a top surface associated with the active region and a bottom surface associated with the active region to exceed the band gap.

In another aspect, the present disclosure relates to a method comprising providing a semiconductor layer comprising an active material. The method may further include providing a gate coupled to the semiconductor layer. The method may further include operating the semiconductor layer in a quantum spin Hall insulator state by using electrons and holes from the active material in response to an application of an electric field to the semiconductor layer via the gate.

The method may further include selecting a thickness of the semiconductor layer and an amount of the electric field such that the semiconductor layer is operable in the quantum spin Hall state by using electrons and holes exclusively from the active material in response to the application of the electric field to the semiconductor layer via the gate. The method may further include providing a second gate coupled to the semiconductor layer, wherein the gate is operable to couple a positive bias voltage to the semiconductor layer, and wherein the second gate is operable to couple a negative bias voltage to the semiconductor layer.

The method may further include straining the active material to modify both a range of the positive bias voltage and a range of the negative bias voltage required to operate the semiconductor layer in the quantum spin Hall insulator state. The active material may comprise a combination of at least one of a first element and a second element, different from the first element in terms of an orbital character of a conduction band and a valance band associated with the first element and the second element, respectively, where with the orbital character is one of a sharp (s) orbital, a principal (p) orbital, a diffuse (d) orbital, or a fundamental (f) orbital.

At least one surface of the semiconductor layer may be passivated using a plasma treatment with at least hydrogen as a precursor. In another example, the active material may comprise at least one element having a conduction band with a different orbital character from a valance band, where the orbital character is one of a sharp (s) orbital, a principal (p) orbital, a diffuse (d) orbital, or a fundamental (f) orbital.

In yet another aspect, the present disclosure relates to a device comprising a semiconductor layer comprising an active material. The device may further include a first dielectric layer formed adjacent to a first surface of the semiconductor layer. The device may further include a first gate formed adjacent to the first dielectric layer. The device may further include a second dielectric layer formed adjacent to a second surface, opposite to the first surface, of the semiconductor layer. The device may further include a second gate, formed adjacent to the second dielectric layer, where the first gate and the second gate are operable to couple a voltage to the semiconductor layer such that the semiconductor layer is operable in a quantum spin Hall insulator state by using electrons and holes from the active material in response to an application of an electric field to the semiconductor layer, perpendicular to the first surface and the second surface.

The semiconductor layer of the device may be operable in a quantum spin Hall state by using electrons and holes exclusively from the active material in response to the application of the electric field to the semiconductor layer via the gate. The active material may comprise a combination of at least one of a first element and a second element, different from the first element in terms of an orbital character of a conduction band and a valance band associated with the first element and the second element, respectively, where with the orbital character is one of a sharp (s) orbital, a principal (p) orbital, a diffuse (d) orbital, or a fundamental (f) orbital. In another example, the active material may comprise at least one element having a conduction band with a different orbital character from a valance band, where the orbital character is one of a sharp (s) orbital, a principal (p) orbital, a diffuse (d) orbital, or a fundamental (f) orbital.

The active material may comprise at least one element having a band gap, and the electric field may be applied in response to a voltage selected to: (1) maintain a chemical potential of an active region associated with the semiconductor layer to be within the band gap and (2) create a voltage difference between a top surface associated with the active region and a bottom surface associated with the active region to exceed the band gap.

It is to be understood that the methods, modules, and components depicted herein are merely exemplary. For example, and without limitation, illustrative types of devices may include quantum computing devices, semiconductor devices, topological quantum computing devices, etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A system comprising:
    a first quantum spin Hall (QSH) region comprising a first set of superconducting islands; and
    a second QSH region, different from the first QSH region, comprising a second set of superconducting islands, different from the first set of superconducting islands, wherein respective superconducting islands in the first set of superconducting islands and the second set of superconducting islands are separated from each other using tunable barriers, and wherein each of the first set of superconducting islands and each of the second set of superconducting islands includes at least one device comprising:
        a semiconductor layer comprising an active material, and
        a gate coupled to the semiconductor layer, wherein the semiconductor layer is operable in a quantum spin Hall insulator state by using electrons and holes from the active material in response to an application of an electric field to the semiconductor layer via the gate.

2. The system of claim 1, wherein the at least one device further comprises a second gate coupled to the semiconductor layer, wherein the gate is operable to couple a positive bias voltage to the semiconductor layer, and wherein the second gate is operable to couple a negative bias voltage to the semiconductor layer.

3. The system of claim 2, wherein the at least one device further comprises a first dielectric layer formed between the gate and the semiconductor layer and a second dielectric layer formed between the second gate and the semiconductor layer.

4. The system of claim 2, wherein the semiconductor layer is operable in a quantum spin Hall state by using electrons and holes exclusively from the active material in response to the application of the electric field to the semiconductor layer via the gate.

5. The system of claim 1, wherein the at least one device further comprises a superconductor layer either formed adjacent to the semiconductor layer, or formed as a floating layer within a stack structure associated with the gate, wherein the superconductor layer is formed between a first dielectric layer formed adjacent to the semiconductor layer and a second dielectric layer formed opposite to the first dielectric layer.

6. The system of claim 1, wherein the active material comprises a combination of at least one of a first element and a second element, different from the first element in terms of an orbital character of a conduction band and a valance band associated with the first element and the second element, respectively, wherein the orbital character is one of a sharp (s) orbital, a principal (p) orbital, a diffuse (d) orbital, or a fundamental (f) orbital.

7. The system of claim 1, wherein the active material comprises at least one element having a conduction band with a different orbital character from a valance band, wherein the orbital character is one of a sharp (s) orbital, a principal (p) orbital, a diffuse (d) orbital, or a fundamental (f) orbital.

8. The system of claim 1, wherein the active material comprises at least one element having a band gap, and wherein the electric field is applied in response to a voltage selected to: (1) maintain a chemical potential of an active region associated with the semiconductor layer to be within the band gap and (2) create a voltage difference between a top surface associated with the active region and a bottom surface associated with the active region to exceed the band gap.

9. A method comprising:
providing a first quantum spin Hall (QSH) region comprising a first set of superconducting islands; and
providing a second QSH region, different from the first QSH region, comprising a second set of superconducting islands, different from the first set of superconducting islands, wherein respective superconducting islands in the first set of superconducting islands and the second set of superconducting islands are separated from each other using tunable barriers, and wherein each of the first set of superconducting conducting islands and each of the second set of superconducting islands includes at least one device comprising;
a semiconductor layer comprising an active material, and
a gate coupled to the semiconductor layer, wherein the semiconductor layer is operable in a quantum spin Hall insulator state by using electrons and holes from the active material in response to an application of an electric field to the semiconductor layer via the gate.

10. The method of claim 9, wherein each of a thickness of the semiconductor layer and an amount of the electric field is selected such that the semiconductor layer is operable in the quantum spin Hall state by using electrons and holes exclusively from the active material in response to the application of the electric field to the semiconductor layer via the gate.

11. The method of claim 9, wherein the at least one device further comprises a second gate coupled to the semiconductor layer, wherein the gate is operable to couple a positive bias voltage to the semiconductor layer, and wherein the second gate is operable to couple a negative bias voltage to the semiconductor layer.

12. The method of claim 9, wherein the active material is strained to modify both a range of the positive bias voltage and a range of the negative bias voltage required to operate the semiconductor layer in the quantum spin Hall insulator state.

13. The method of claim 9, wherein the active material comprises a combination of at least one of a first element and a second element, different from the first element in terms of an orbital character of a conduction band and a valance band associated with the first element and the second element, respectively, wherein the orbital character is one of a sharp (s) orbital, a principal (p) orbital, a diffuse (d) orbital, or a fundamental (f) orbital.

14. The method of claim 9, wherein at least one surface of the semiconductor layer is passivated using a plasma treatment with at least hydrogen as a precursor.

15. The method of claim 9, wherein the active material comprises at least one element having a conduction band with a different orbital character from a valance band, wherein the orbital character is one of a sharp (s) orbital, a principal (p) orbital, a diffuse (d) orbital, or a fundamental (f) orbital.

16. A system comprising:
a first quantum spin Hall (QSH) region comprising a first set of superconducting islands; and
a second QSH region, different from the first QSH region comprising a second set of superconducting islands, different from the first set of superconducting islands, wherein respective superconducting islands in the first set of superconducting islands and the second set of superconducting islands are separated from each other using tunable barriers, and wherein each of the first set of superconducting islands and each of the second set of superconducting islands includes at least one device comprising:
a semiconductor layer comprising an active material,
a first dielectric layer formed adjacent to a first surface of the semiconductor layer,
a first gate formed adjacent to the first dielectric layer,
a second dielectric layer formed adjacent to a second surface, opposite to the first surface, of the semiconductor layer, and
a second gate formed adjacent to the second dielectric layer, wherein the first gate and the second gate are operable to couple a voltage to the semiconductor layer such that the semiconductor layer is operable in a quantum spin Hall insulator state by using electrons and holes from the active material in response to an application of an electric field to the semiconductor layer, perpendicular to the first surface and the second surface.

17. The system of claim 16, wherein the semiconductor layer is operable in a quantum spin Hall state by using electrons and holes exclusively from the active material in response to an application of an electric field to the semiconductor layer via the gate.

18. The system of claim 16, wherein the active material comprises a combination of at least one of a first element and a second element, different from the first element in terms of an orbital character of a conduction band and a valance band associated with the first element and the second element, respectively, wherein the orbital character is one of a sharp (s) orbital, a principal (p) orbital, a diffuse (d) orbital, or a fundamental (f) orbital.

19. The system of claim 16, wherein the active material comprises at least one element having a conduction band with a different orbital character from a valance band, wherein the orbital character is one of a sharp (s) orbital, a principal (p) orbital, a diffuse (d) orbital, or a fundamental (f) orbital.

20. The system of claim 19, wherein the active material comprises at least one element having a band gap, and wherein the voltage is selected to: (1) maintain a chemical potential of an active region associated with the semiconductor layer to be within the band gap and (2) create a voltage difference between a top surface associated with the active region and a bottom surface associated with the active region to exceed the band gap.

* * * * *